(12) United States Patent
Yamauchi

(10) Patent No.: US 11,220,757 B2
(45) Date of Patent: Jan. 11, 2022

(54) METHOD FOR MANUFACTURING SOLID OXIDE AND DEVICE THEREFOR

(71) Applicant: OSAKA UNIVERSITY, Suita (JP)

(72) Inventor: Kazuto Yamauchi, Suita (JP)

(73) Assignee: OSAKA UIVERSITY, Suita (JP)

( * ) Notice: Subject to any disclaimer, the term of this patent is extended or adjusted under 35 U.S.C. 154(b) by 616 days.

(21) Appl. No.: 14/363,090

(22) PCT Filed: Dec. 5, 2012

(86) PCT No.: PCT/JP2012/081504
§ 371 (c)(1),
(2) Date: Jun. 5, 2014

(87) PCT Pub. No.: WO2013/084934
PCT Pub. Date: Jun. 13, 2013

(65) Prior Publication Data
US 2014/0326612 A1    Nov. 6, 2014

(30) Foreign Application Priority Data
Dec. 6, 2011 (JP) .............................. JP2011-266659

(51) Int. Cl.
*C25F 3/16* (2006.01)
*B24B 37/04* (2012.01)
(Continued)

(52) U.S. Cl.
CPC .............. *C25F 3/16* (2013.01); *B24B 37/046* (2013.01); *C25F 3/26* (2013.01); *C30B 29/16* (2013.01)

(58) Field of Classification Search
CPC ............... B24B 37/046; C25F 3/16–30; C30B 29/16–32
See application file for complete search history.

(56) References Cited

U.S. PATENT DOCUMENTS

| 5,035,769 A * | 7/1991 | Stout | ........................ C23F 1/10 |
| | | | 216/100 |
| 2004/0072445 A1* | 4/2004 | Sun | ........................... C25F 3/02 |
| | | | 438/710 |

(Continued)

FOREIGN PATENT DOCUMENTS

| JP | 2003-225830 A1 | 8/2003 |
| JP | 2006-114632 A1 | 4/2006 |

(Continued)

OTHER PUBLICATIONS

International Search Report for International Application No. PCT/JP2012/081504 dated Mar. 12, 2013.

*Primary Examiner* — Salil Jain
(74) *Attorney, Agent, or Firm* — Kratz, Quintos & Hanson, LLP

(57) ABSTRACT

Provided is a method for manufacturing a solid oxide and a device therefor, capable of manufacturing a solid oxide used as an optical material without introducing damaged layers caused by machining, which does not use any polishing agent or abrasive grains including rare earth elements, or does not use any solution, such as hydrogen fluoride, for which handling is difficult and which imposes a heavy environmental burden. In the presence of water 1, a solid oxide in which one or more kinds of elements are bonded through oxygen is used as an object to be manufactured; a catalyst substance, which cuts a backbond between an oxygen element and another element, forming the solid oxide, by dissociation of a water molecule, and adsorbs it, and helps production of a decomposition product by hydrolysis, is used as a machining reference surface (3); the object (5) to be manufactured and the machining reference surface are disposed so that they are brought into contact with each other or they are brought very close to each other in the presence of water; a potential of the machining reference (Continued)

surface is adjusted to a range where neither $H_2$ nor $O_2$ is produced; and the object to be manufactured is moved relative to the machining reference surface thereby to remove a decomposition product from the surface of the object to be manufactured.

19 Claims, 13 Drawing Sheets

(51) Int. Cl.
    *C25F 3/26*     (2006.01)
    *C30B 29/16*     (2006.01)

(56) References Cited

U.S. PATENT DOCUMENTS

2008/0014709 A1* 1/2008 Wang ............... B23H 5/08 438/424

2008/0073222 A1* 3/2008 Yamauchi ............... C23C 8/40 205/655
2008/0188162 A1* 8/2008 Kobata ............... B24B 49/10 451/8
2009/0095712 A1* 4/2009 Yamauchi ......... H01L 21/02019 216/53
2013/0105331 A1* 5/2013 Zhan ...................... C25F 7/00 205/668

FOREIGN PATENT DOCUMENTS

| | | |
|---|---|---|
| JP | 2006-176885 A1 | 7/2006 |
| JP | 3837783 B2 | 10/2006 |
| JP | 2008-198673 A1 | 8/2008 |
| JP | 4337827 B2 | 9/2009 |
| JP | 2011-146695 A1 | 7/2011 |

* cited by examiner

[Fig. 3]

[Fig. 4]
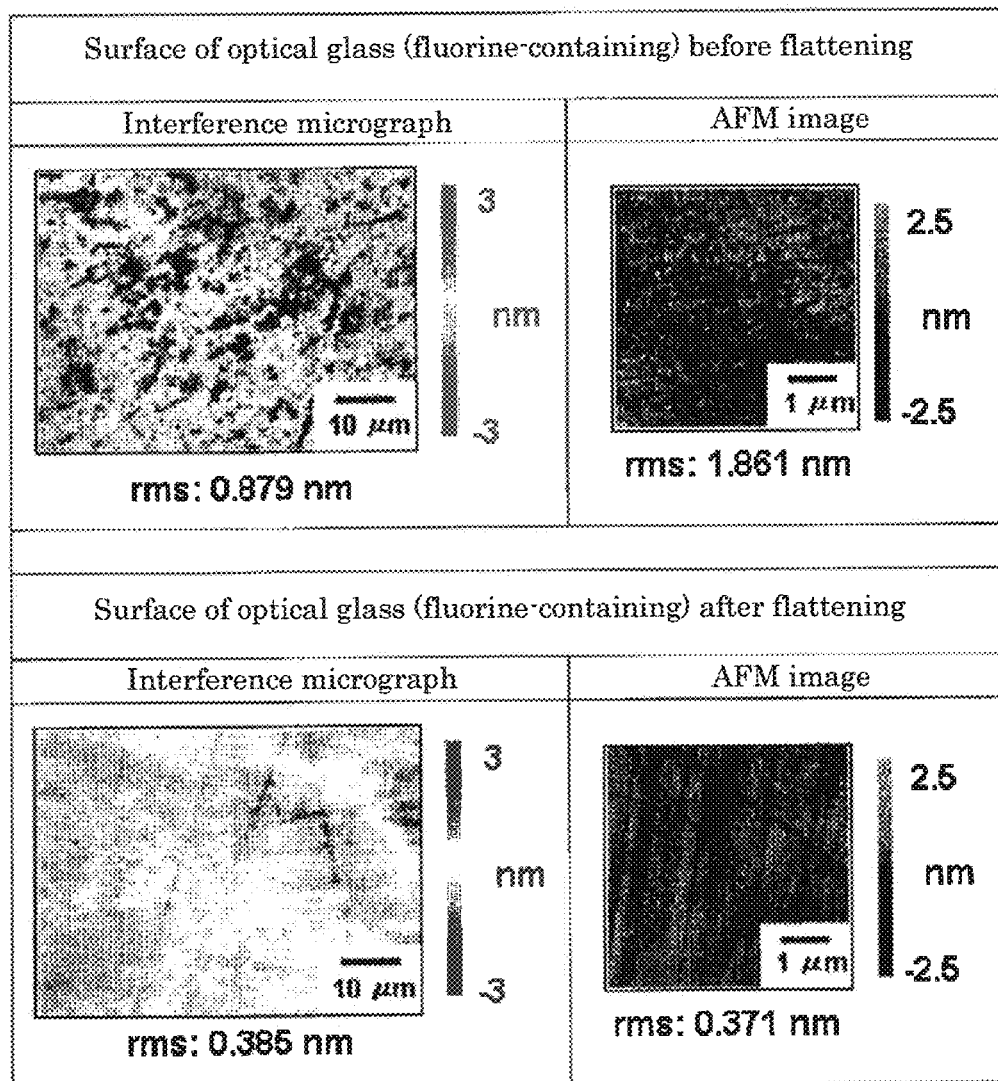

[Fig. 5]
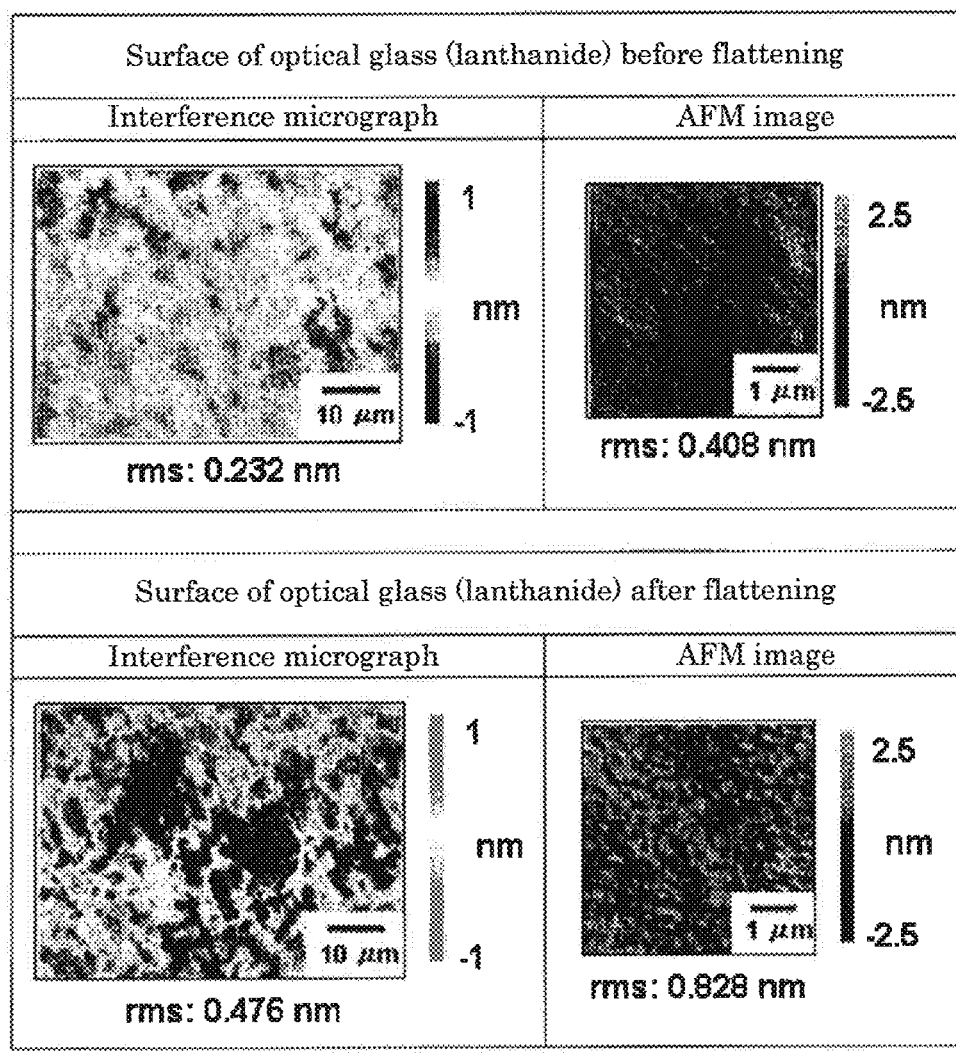

[Fig. 6]
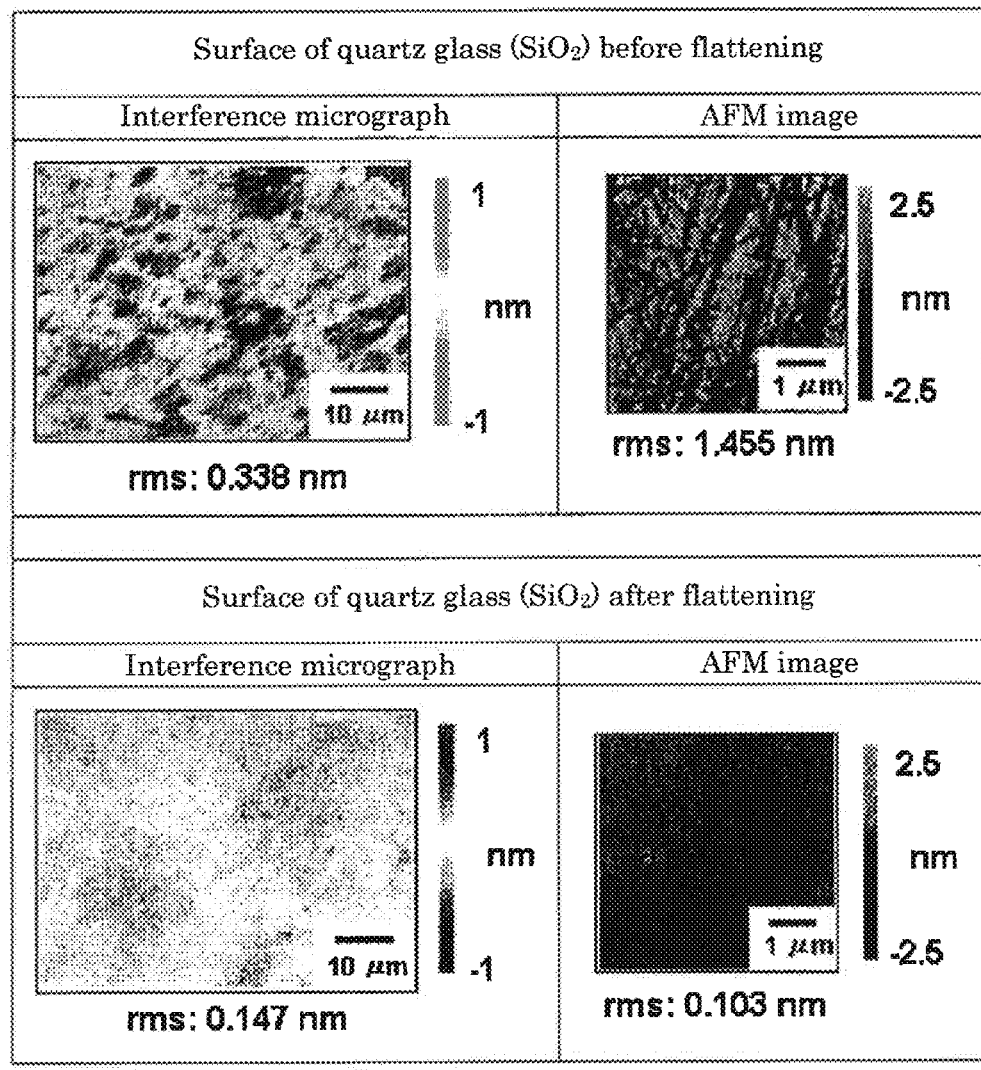

[Fig. 7]
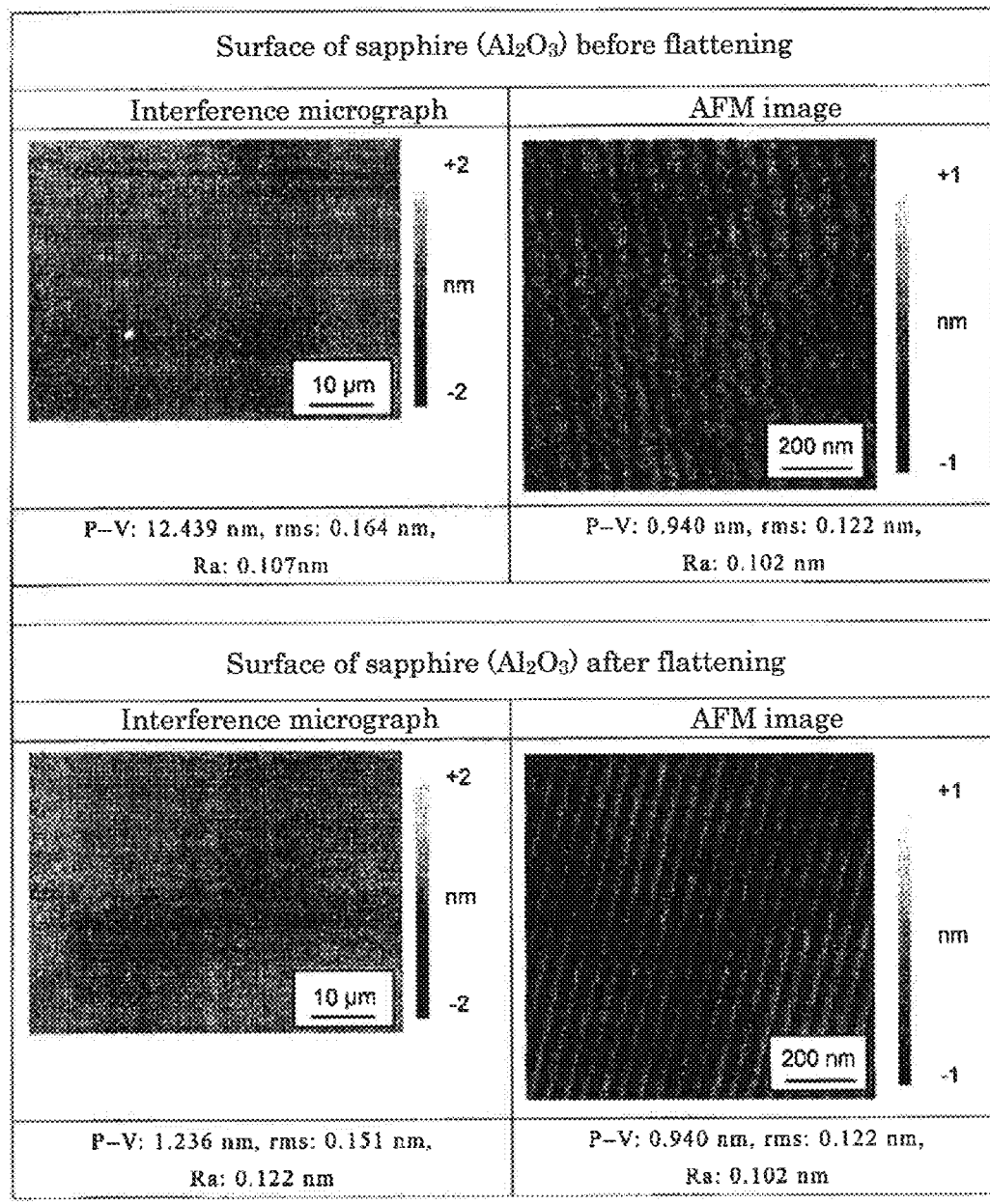

[Fig. 8]
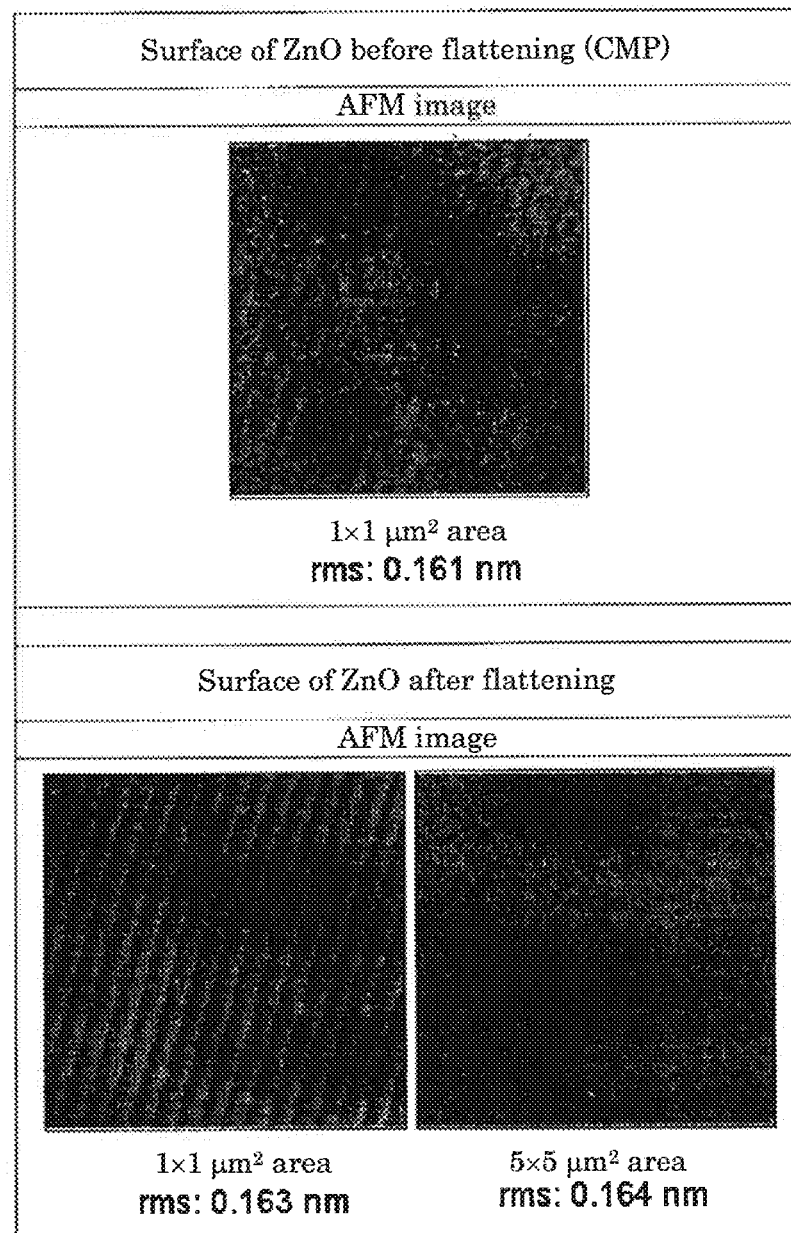

[Fig. 9]
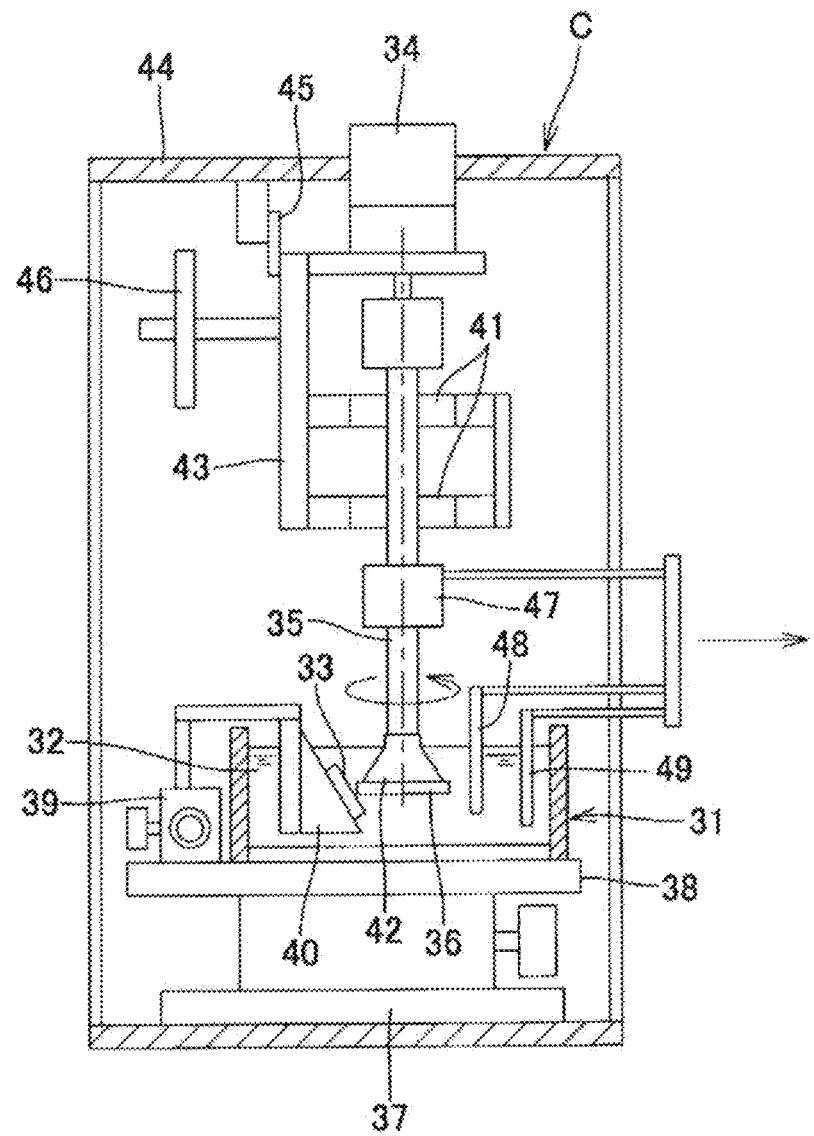

[Fig. 10]
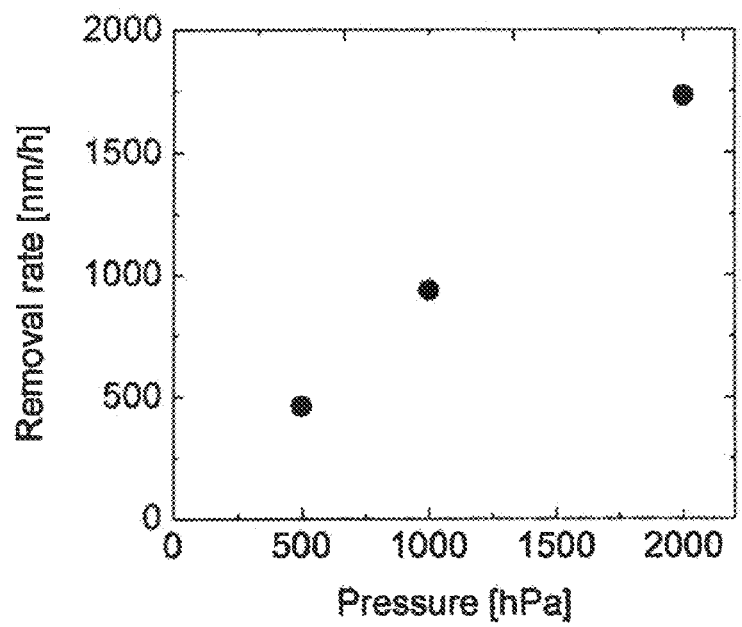
[Fig. 11]
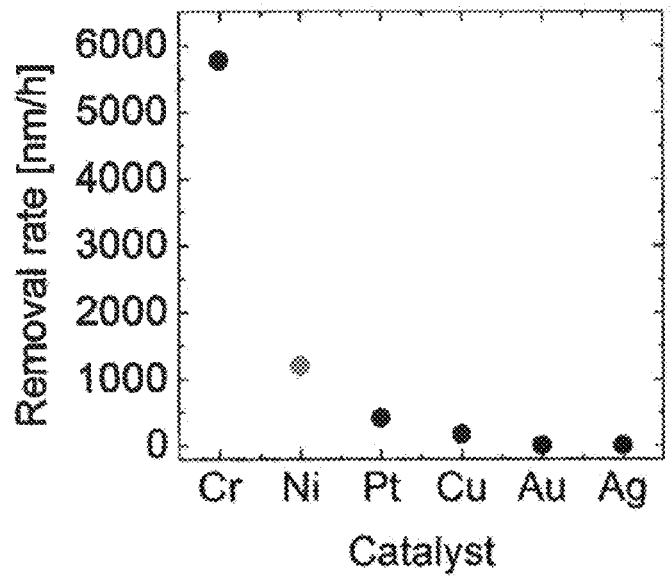

[Fig. 12]
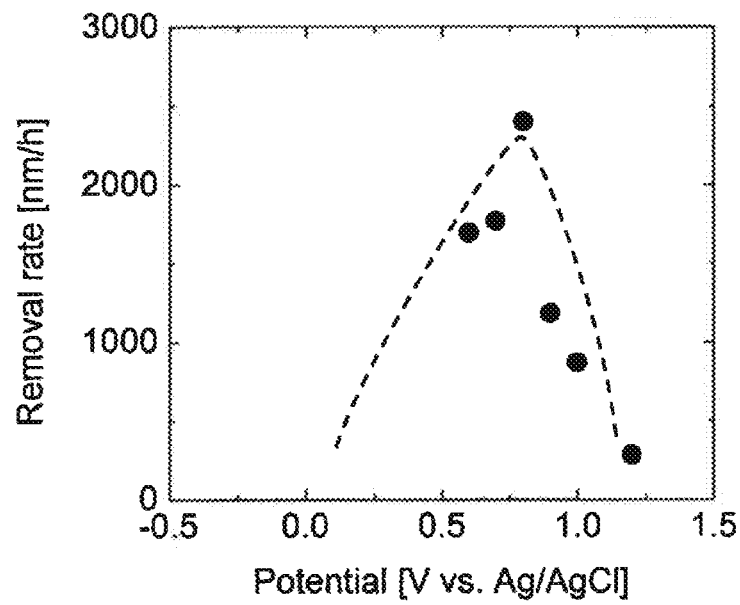
[Fig. 13]
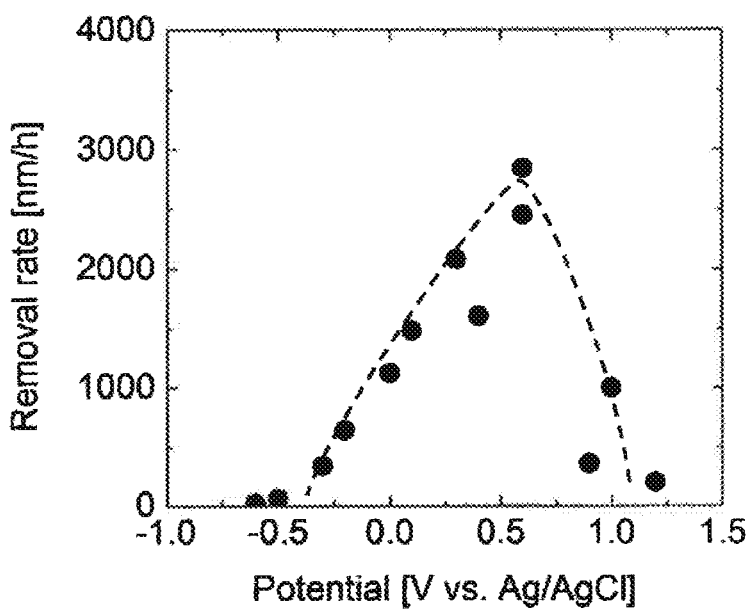

[Fig. 14]
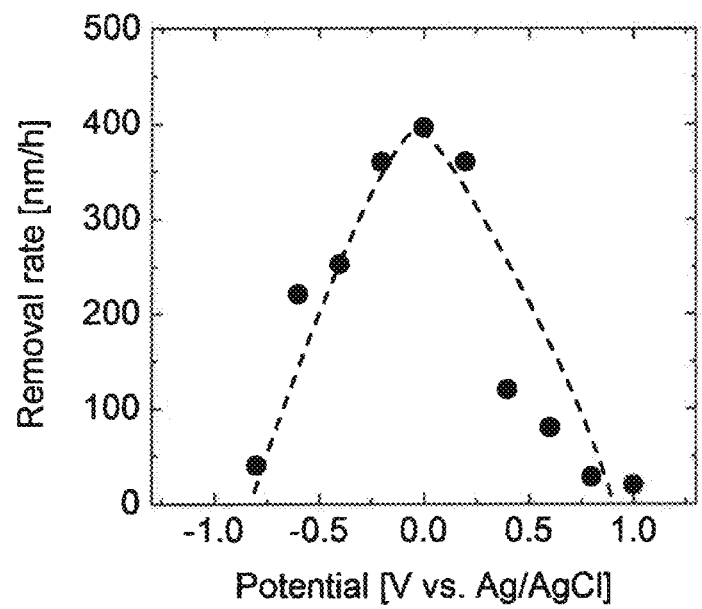
[Fig. 15]
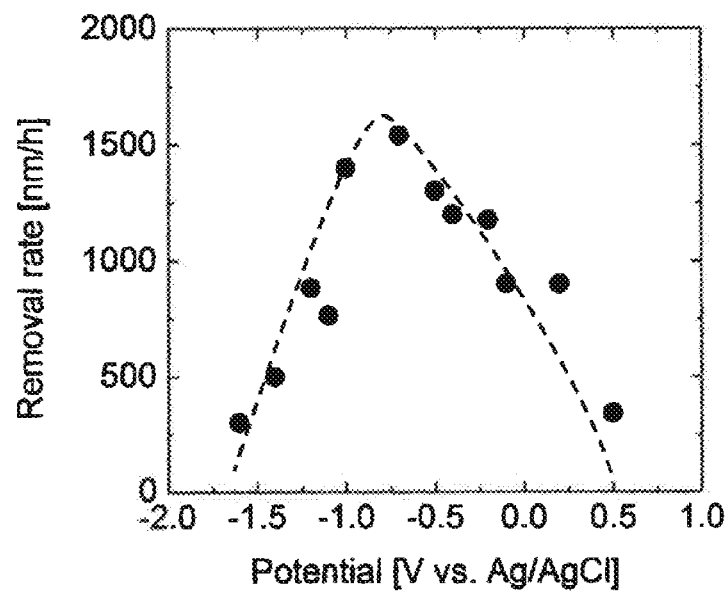

[Fig. 16]
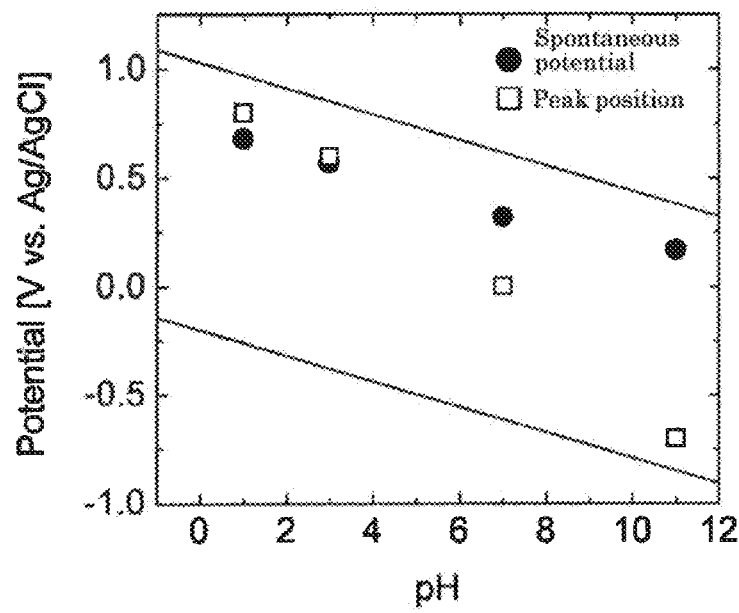
[Fig. 17]
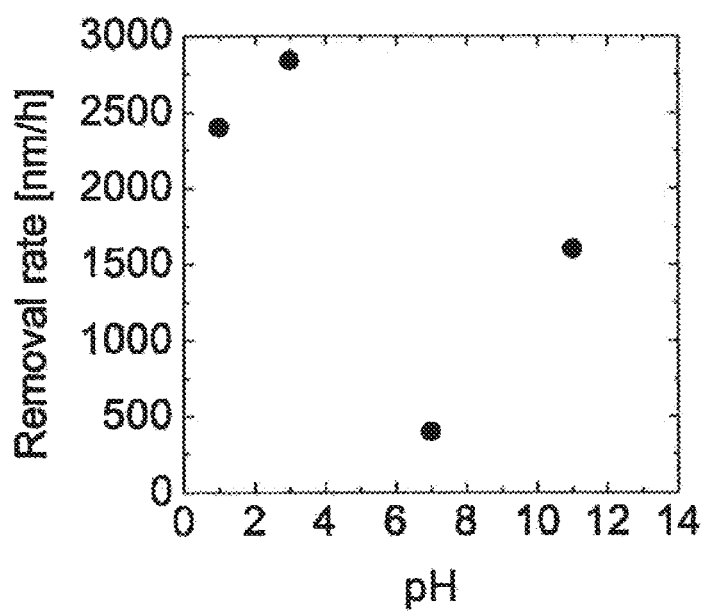

[Fig. 18]
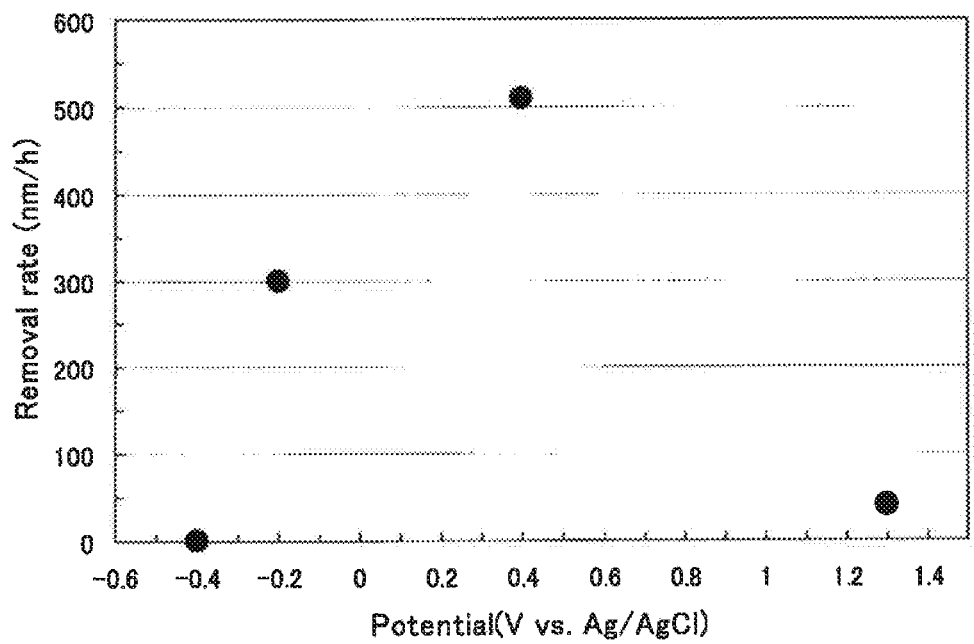
[Fig. 19]
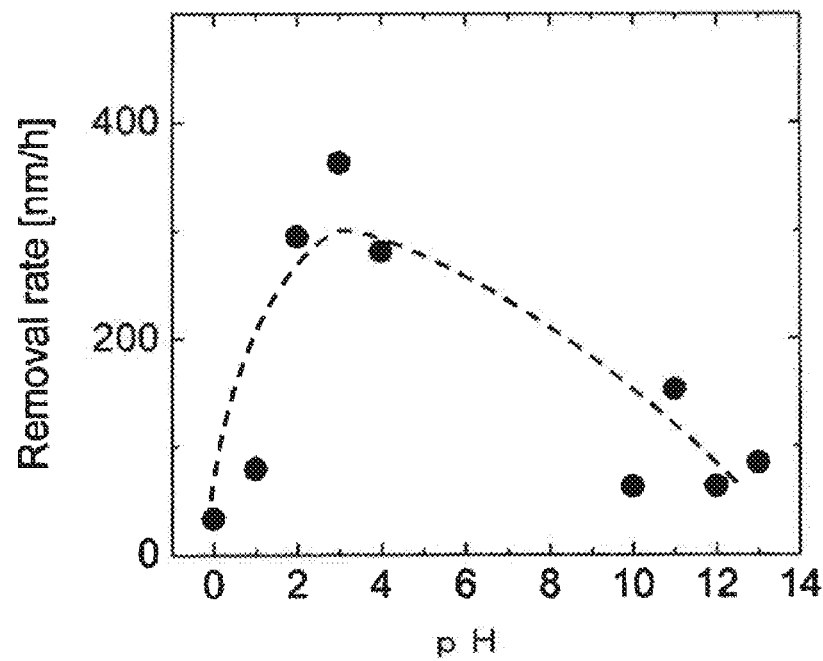

METHOD FOR MANUFACTURING SOLID OXIDE AND DEVICE THEREFOR

TECHNICAL FIELD

The present invention relates to a method for manufacturing a solid oxide and a device therefor, and more particularly, to a method for manufacturing a solid oxide, which imposes a less environmental burden, and a device therefor.

BACKGROUND ART

Various methods have hitherto been proposed for flattening or polishing a surface of an object to be manufactured. Typically CMP (Chemical Mechanical Polishing) and recently CARE (CAtalyst-Referred Etching) have been proposed.

On the other hand, in an optical field and a production field of semiconductor devices, CMP has consolidated its firm position as an essential polishing means. CMP is a technique in which a mechanical polishing (surface-removing) effect due to a relative motion between a polishing agent and an object to be polished is increased by a surface chemical action, which exists in a polishing agent (abrasive grains) itself, or an action of a chemical component included in polishing liquid, whereby a smooth polished surface is obtained at a high speed. In general, polishing is performed by holding an object to be polished with a member called a carrier, pressing it against a flat plate (a lap) to which a polishing Cloth or polishing pad is attached, and allowing the object to move relative to the plate, while slurry including various chemical components and hard fine abrasive grains is flown. The chemical components change a surface of the object to be polished, and thus a machining speed can be more increased than in a case where polishing is performed by using a polishing agent alone. In addition, fine scratches remaining on the surface or a damaged layer caused by machining, remaining around the surface, which are generated in a case of polishing with the polishing agent alone, can be extremely reduced, and thus an ideal smooth surface can be obtained. Here, a polishing agent for CMP mainly uses fine particles of cerium oxide ($CeO_2$) or cerium oxide including a lanthanide, but the cost of cerium, which is a rare-earth element, has risen these days, and its acquisition has been interfered with.

The present inventors have proposed in Patent Document 1 a catalyst-assisted chemical processing method in which an object to be manufactured is put in treating liquid in which a molecule including a halogen, which does not dissolved in the object to be manufactured in a normal state, is dissolved; a catalyst including a platinum, gold, or ceramic solid catalyst is disposed so that it is brought into contact with or is brought very close to a surface to be manufactured of the object to be manufactured; and a halogenated compound, which produced in a chemical reaction between halogen radicals produced on the surface of the catalyst and surface atoms of the object to be manufactured, is eluted, thereby processing the object to be manufactured. Specifically, an example in which Si, SiC, sapphire, or the like is manufactured using a hydrogen fluoride solution or a hydrogen chloride solution as the treating liquid, in which a molecule including a halogen is dissolved, is shown.

The manufacturing method based on a catalyst reference surface is an ultraprecisely flattening technique, named CARE by the present inventors. CARE is a manufacturing technique using neither polishing agent nor abrasive grains at all and is an ideal manufacturing method which does not introduce scratches or damaged layers caused by machining on the surface to be manufactured at all, but air tightness of a treatment space and a treatment facility for exhaust gas and waste fluid are necessary because treating liquid in which a molecule including a halogen is dissolved, in particular a hydrogen fluoride solution, is used, and thus it has a defect in which its handling is more difficult and the cost for apparatuses is higher than CMP.

Patent Document 2 proposes a polishing method in which a substrate surface of a chemical compound semiconductor including any of Ga, Al, and In, and a surface of a polishing pad having a conductive member at least a part on the surface, which is brought into contact with the substrate, are moved relative to each other, while they are allowed to be brought into contact with each other, in the presence of weakly acidic water, water in which air is dissolved, or electrolytic ionized water, thereby polishing the substrate surface. Here, it discloses that the conductive member is a noble metal, a transition metal, graphite, a conductive resin, conductive rubber, or a conductive organic material, and after a voltage is applied to between the polishing pad and the substrate to generate etching pits, the application of the voltage is stopped, and then polishing with the polishing pad is performed to increase a polish rate. The document also discloses that the weakly acidic water or the water in which air is dissolved has a pH of 3.5 to 6.0, and the electrolytic ionized water has a pH of 3.5 to 6.0 or 8.0 or more.

A polishing mechanism in Patent Document 2 is as follows: A strain is generated at a contact part between a surface of a substrate and a conductive member such as platinum of a polishing pad, electrons in a valence band are excited to a conduction band to generate electron-hole pairs, then, the electrons excited in the conduction band are moved to the conductive member such as platinum (having a large work function), and $OH^-$ ions or $H_2O$ molecules in water act on the positive holes remaining on the substrate surface; as a result, only the contact part is oxidized, and oxides of Ga, Al, and In formed on the contact part are dissolved in water, because they are soluble in a weak acid or weak alkali such as a carbon dioxide solution, thus resulting in removal the oxides from the substrate surface. According to the mechanism, the substrate surface, which is brought into contact with the conductive member, is first oxidized, and the resulting oxides are eluted in weakly acidic water or water in which air is dissolved, but it is not a theory capable of applying to an object to be manufactured which is originally an oxide. The invention described in Patent Document 2, therefore, does not assume the polishing or machining of the solid oxide at all.

On the other hand, Patent Document 3 discloses a machining method in which only ultrapure water, from which a trace amount of inevitable impurities have been removed, is used; an ionic product is increased utilizing an electrochemical reaction on a surface of a solid having an ion exchange function or catalyst function, disposed in the ultrapure water; an object to be machined is immersed in the ultrapure water having the increased concentration of hydroxyl groups or hydroxyl ions; the object to be machined is allowed to serve as a positive electrode, or a potential of the object to be machined is maintained at a high level to draw the hydroxyl ions on the surface of the object to be machined; and an object to be machined is subjected to a removal machining or an oxide film-forming machining by a chemical elution reaction with the hydroxyl groups or hydroxyl ions, or an oxidization reaction.

The machining method described in Patent Document 3 is basically an electrolysis machining in which a high voltage is applied, and a treatment in which the number of hydroxyl groups is increased, in which a concentration of hydroxyl groups or hydroxyl ions in water is increased, is an important requirement. The treatment in which the number of hydroxyl groups is increased uses a solid surface having an ion exchange function or a catalyst function, but there are defects in which the solid surface is damaged by contact with the object to be machined or it adheres to the surface of the object to be machined. The machining, accordingly, basically proceeds in a manner in which the hydroxyl groups or hydroxyl ions produced on the solid surface are supplied to the surface of the object to be machined in a non-contact state between the solid surface having the ion exchange function or the catalyst function with the object to be machined. The machining method, however, has not reached practical application yet, because the method has no machining reference surface, a surface having a high precision cannot be obtained, and a machining speed is slow. The treatment in which the number of hydroxyl groups is increased may include, in addition to the above, an electrolysis treatment (see Patent Document 4), a high temperature and high pressure treatment, and a water-plasma treatment (see Patent Document 5). A case where the electrolysis treatment is used at the same time has defects in which bubbles generated on the object to be machined or the electrode surface cause variation in a machining speed or reduction of the machining speed. The high temperature and pressure treatment is not suitable for industrial machining. The water-plasma treatment causes roughening on the surface of the object to be machined, because plasma is generated together with violent generation of bubbles in water.

CITATION LIST

Patent Literatures

Patent Document 1: JP-A No. 2006-114632
Patent Document 2: JP-A No. 2011-146695
Patent Document 3: Japanese Patent No. 3837783
Patent Document 4: JP-A No. 2006-176885
Patent Document 5: Japanese Patent No. 4337827

SUMMARY OF INVENTION

Technical Problem

There has hitherto been glass or sapphire manufacturing using a strong hydrogen fluoride solution or polishing agent, but there has been no practical manufacturing method in which a hydrogen fluoride solution or a polishing agent is not used at all for manufacturing a solid oxide generally used including optical materials.

In view of the circumstances described above, the problem to be solved by the present invention is to provide a method for manufacturing a solid oxide and a device therefor, capable of manufacturing a solid oxide used as an optical material without introducing damaged layers caused by machining, which does not use any polishing agent or abrasive grains including rare earth elements, or does not use any solution for which handling is difficult and which imposes a heavy environmental burden, such as hydrogen fluoride.

Solution to Problem

In order to solve the problems described above, the present invention invents a method for manufacturing an object to be manufactured, which is a solid oxide in which one or more kinds of elements are bonded through oxygen or a multicomponent solid oxide formed of a plurality of the oxides, including: subjecting a surface of the object to be manufactured to flattening or machining to an arbitrary curved surface, wherein a catalyst substance, which cuts a backbond between an oxygen element and another element, forming the solid oxide, by dissociation of a water molecule, and adsorbs it, and helps production of a decomposition product by hydrolysis, is used as a machining reference surface; the object to be manufactured and the machining reference surface are disposed so that they are brought into contact with each other or they are brought very close to each other in the presence of water; a potential of the machining reference surface is adjusted to a range where neither $H_2$ nor $O_2$ is produced, including a spontaneous potential; and the object to be manufactured is moved relative to the machining reference surface thereby to remove the decomposition product from the surface of the object to be manufactured.

In addition, the present invention invents a device for manufacturing a solid oxide, which is a manufacturing device of a surface of an object to be manufactured, the object to be manufactured being a solid oxide in which one or more kinds of elements are bonded through oxygen or a multicomponent solid oxide formed of a plurality of the oxides, including: a container holding water; a machining head, which includes a machining reference surface having, at least on its surface, a catalyst substance, which substance cuts a backbond between an oxygen element and another element forming the solid oxide by dissociation of a water molecule, and adsorbs it, and helps production of a decomposition product by hydrolysis, and is immersed with water and disposed in the container; a holder of the object to be manufactured, which holds the object to be manufactured and allows it to be immersed in water, and is disposed in the container so that it is brought into contact with or is brought very close to the machining reference surface; and a driving mechanism, which allows the machining head and the holder of the object to be manufactured to be moved relative to each other while they are brought into contact with or are brought very close to each other, wherein the decomposition product is eluted in water by adjusting the potential of the machining reference surface to a range where neither $H_2$ nor $O_2$ is produced, including a spontaneous potential, or the decomposition product is removed from the surface of the object to be manufactured by the relative motion of the object to be manufactured and the machining reference surface, whereby the surface of the object to be manufactured is manufactured.

The present invention also invents a device for manufacturing a solid oxide, which is a manufacturing device of a surface of an object to be manufactured, the object to be manufactured being a solid oxide in which one or more kinds of elements are bonded through oxygen or a multicomponent solid oxide formed of a plurality of the oxides, including: a machining head, which includes a machining reference surface having, at least on its surface, a catalyst substance, which substance cuts a backbond between an oxygen element and another element forming the solid oxide by dissociation of a water molecule, and adsorbs it, and helps production of a decomposition product by hydrolysis; a holder of the object to be manufactured, which holds the object to be manufactured so as to face it to the machining reference surface; a driving mechanism, which allows the machining reference surface in the machining head and the object to be manufactured held in the holder of the object to be manufactured to be moved relative to each other while they are brought into contact with or are brought very close to each other; and a water-supplying means, which supplies water to between the machining reference surface in the machining head and the object to be manufactured held in the holder of the object to be manufactured, wherein the decomposition product is eluted in water by adjusting the potential of the machining reference surface to a range where neither $H_2$ nor $O_2$ is produced, including a spontaneous potential, or the decomposition product is removed from the surface of the object to be manufactured by the relative motion of the object to be manufactured and the machining reference surface, whereby the surface of the object to be manufactured is manufactured.

In the inventions described above, it is preferable to use a catalyst substance surface including a metal element in which a d-orbital of an electron thereof is in the vicinity of Fermi level, is used as the machining reference surface. It is more preferable that the metal element is a transition metal element. It is particularly preferable that the machining reference surface has a conductive catalyst substance at least on its surface, and a machining speed is controlled by changing a potential of the catalyst substance.

It is also preferable that the water is pure water or $H_2$-purged water using ultrapure water, and the machining is performed in a state in which hydrogen is adsorbed in the catalyst substance on the machining reference surface.

It is also preferable that the water is a mixture in which pure water or ultrapure water is mixed with a complex helping dissolution of the decomposition product.

Furthermore, it is also preferable that a pH of the water is adjusted to a range of 2 to 12 depending on the decomposition product.

Here, in the present invention, the machining reference surface is based on the concept of a surface formed from the catalyst substance on a whole or a part of a hard surface, a surface obtained by film-forming the catalyst substance on a whole or a part of the hard surface, a surface formed from a catalyst substance on a whole or a part of a soft surface, a surface obtained by film-forming the catalyst substance on a whole or a part of the soft surface, a surface on which the catalyst substance appears at least on a part of the surface obtained by kneading the catalyst substance in a base material or carrying the catalyst substance on the base material.

Advantageous Effects of Invention

According to the method for manufacturing a solid oxide and the device therefor of the present invention as above, a solid oxide in which one or more kinds of elements are bonded through oxygen or a multicomponent solid oxide formed of a plurality of oxides is used as an object to be manufactured; the object to be manufactured and the machining reference surface having, at least on its surface, the catalyst substance, which cuts a backbond between an oxygen element and another element, forming the solid oxide, by dissociation of a water molecule, and adsorbs it, and helps production of a decomposition product by hydrolysis, are disposed so that they are brought into contact with each other or they are brought very close to each other in the presence of water; a potential of the machining reference surface is adjusted to a range where neither $H_2$ nor $O_2$ is produced, including a spontaneous potential; and the object to be manufactured is moved relative to the machining reference surface thereby to remove the decomposition product from the surface of the object to be manufactured, whereby the surface of the object to be manufactured is manufactured; and thus the following effects are exhibited. The surface of the solid oxide such as an optical material can be manufactured without introducing damaged layers caused by machining because the machining is chemical, and a surface roughness can be extremely reduced because a polishing agent or abrasive grains are not used at ail on the surface to be manufactured. As the hydrogen fluoride, other chemicals whose handling is difficult, and fine particles are not used, waste liquid can be very easily treated, it can be said that the method is a manufacturing method with a less environmental burden, and further the method has an advantage of remarkably improved working environment. Furthermore, the cost is not affected by the market of starting materials, because any rare-earth element is not used, and thus the running cost can be markedly reduced.

When a catalyst substance surface including a metal element, in which a d-orbital of an electron thereof is in the vicinity of Fermi level, is used as the machining reference surface, an effect of taking electrons from water molecules and sharing them is large, and thus an action is enhanced in which a backbond between an oxygen element and another element, forming the solid oxide, is cut by dissociation of a water molecule, and is adsorbed, and production of a decomposition product by hydrolysis is helped, thus resulting in the increased machining speed. In particular, when the metal element is a transition metal element, the effect is markedly exhibited.

In a case where the machining reference surface has the conductive catalyst substance at least on its surface, the machining efficiency can be increased to an extent in which the method can be industrially utilized, by narrowing a space between the object to be manufactured and the catalyst substance to an extent in which, when dissociation of water occurs and a backbond of the solid oxide becomes loose, free electrons of the catalyst substance reduce obstacle of reactions in the both phenomena above, and, at the same time, machining with a high precision can be performed, because the catalyst substance serves as the machining reference surface. Further, according to the present invention, the machining speed can be controlled by adjusting the potential of the catalyst substance, forming the machining reference surface, to a range where neither $H_2$ nor $O_2$ is produced, including a spontaneous potential, and thus a manufacturing condition can be easily changed from rough machining with a high machining speed to a precision machining with a slow machining speed. According to the present invention, a sequential manufacturing from rough machining to precision machining can be performed only by changing the potential of the conductive catalyst substance while the object to be manufactured is set on a manufacturing device, and thus a working efficiency is high. On the other hand, conventionally, when the same manufacturing device is used, it is necessary that a machining operation is stopped, and a polishing pad, a polishing agent, or abrasive grains are replaced, or when specialized devices of a device for rough machining and a device for precision machining are used, it is necessary to transfer the object to be manufactured between the devices.

The machining method of the present invention does not use a means which causes bubble generation, such as supply of ions to the object to be manufactured using a high electric field, and thus the machining with a high precision can be realized.

BRIEF DESCRIPTION OF THE DRAWINGS

FIG. 3 is a simplified explanatory diagram of a water circulation system producing $H_2$-purged water.

FIG. 4 shows phase shift interference micrographs and AFM images of an optical glass (fluorine-containing glass) surface before and after flattening.

FIG. 5 shows phase shift interference micrographs and AFM images of an optical glass (lanthanide glass) surface before and after flattening.

FIG. 6 shows phase shift interference micrographs and AFM images of a quartz glass surface before and after flattening.

FIG. 7 shows phase shift interference micrographs and AFM images of a sapphire surface before and after flattening.

FIG. 8 shows AFM images of ZnO surface before and after flattening.

FIG. 9 is a simplified cross-sectional view showing a manufacturing device of a third embodiment (a local manufacturing device) of the present invention.

FIG. 10 is a graph showing contact pressure dependency of a machining speed.

FIG. 11 is a graph showing machining speeds of quartz glass for various catalyst substances (catalytic metals).

FIG. 12 is a graph showing catalyst potential dependency of a machining speed in pH 1 (an aqueous $HNO_3$ solution).

FIG. 13 is a graph showing catalyst potential dependency of a machining speed in pH 3 (an aqueous $HNO_3$ solution).

FIG. 14 is a graph showing catalyst potential dependency of a machining speed in pH 7 (phosphate buffer).

FIG. 15 is a graph showing catalyst potential dependency of a machining speed in pH 11 (an aqueous KOH solution).

FIG. 16 is a graph showing a relationship between a spontaneous potential and a peak position of a machining speed at each pH.

FIG. 17 is a graph showing the maximum machining speed at the pH of each solution.

FIG. 18 is a graph showing a relationship between a potential and a machining speed when quartz glass is subjected to flattening in aqueous hydrogen.

FIG. 19 is a graph showing relationship between a pH and a machining speed in manufacturing of quartz glass under a spontaneous potential when a local manufacturing device is used.

DESCRIPTION OF EMBODIMENTS

Figure 1:
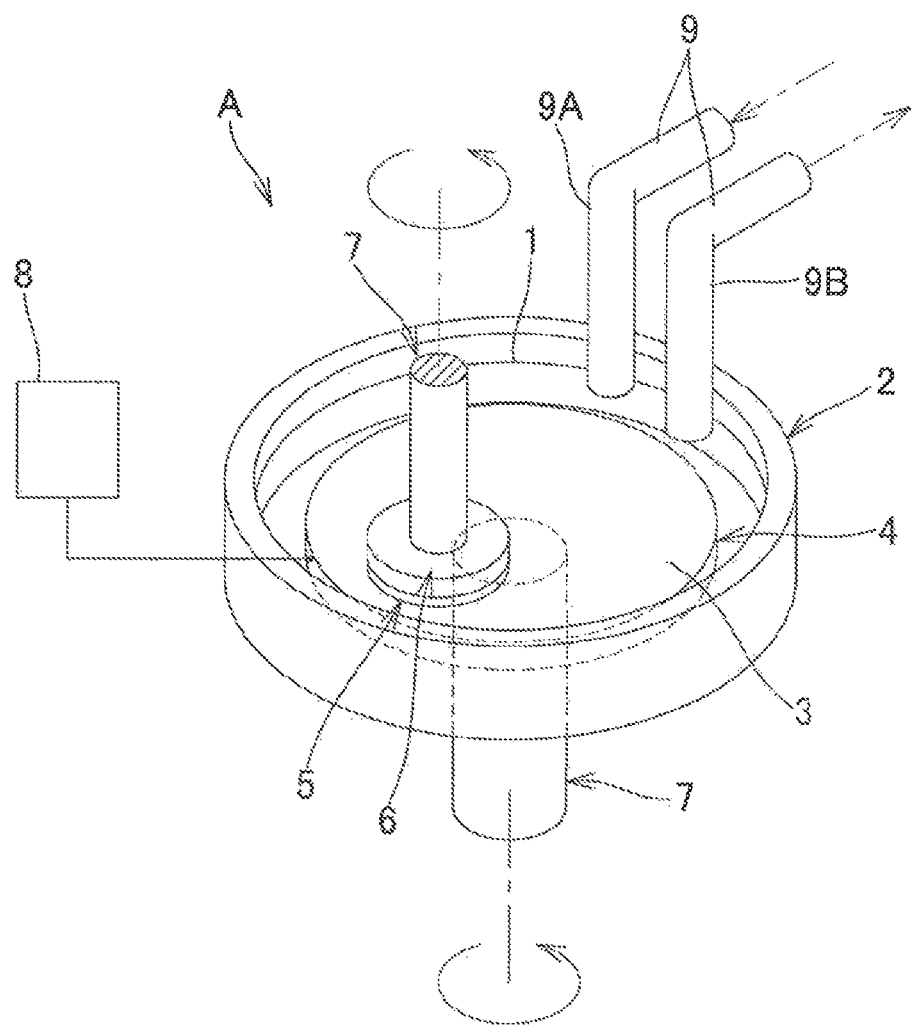
FIG. 1 is a simplified perspective view showing a manufacturing device of a first embodiment (a flattening device) of the present invention.

The method for manufacturing a solid oxide of the present invention is a method in which a solid oxide in which one or more kinds of elements are bonded through oxygen or a multicomponent solid oxide formed of a plurality of the oxides is used as an object to be manufactured; a catalyst substance, which cuts a backbond between an oxygen element and another element, forming the solid oxide, by dissociation of a water molecule, and adsorbs it, and helps production of a decomposition product by hydrolysis, is used as a machining reference surface; the object to be manufactured and the machining reference surface are disposed so that they are brought into contact with each other or they are brought very close to each other in the presence of water; a potential of the machining reference surface is adjusted to a range where neither $H_2$ nor $O_2$ is produced, including a spontaneous potential; and the object to be manufactured is moved relative to the machining reference surface thereby to remove the decomposition product from the surface of the object to be manufactured, whereby the surface of the object to be manufactured is subjected to flattening or machining to an arbitrary curved surface. Here, treatments generally called polishing or washing belong to the category of manufacturing of the present invention. The polishing corresponds to flattening, and washing corresponds to minimal quantity machining in which impurities or foreign bodies are removed from a surface while a machining quantity is reduced to the minimum.

In general, the oxide is a compound formed of oxygen and other elements. Oxygen reacts with almost all elements to form an oxide, and, in many cases, a basic oxide is formed from a metal element, an acidic oxide is formed from a non-metal element, and an amphoteric oxide is formed from an element which is between basicity and acidity. In the present invention, among the oxides, a solid oxide in a normal condition, which is a solid oxide in which one or more kinds of elements are bonded through oxygen or a multicomponent solid oxide formed of a plurality of the oxides, is targeted. In particular, the present invention can be preferably applied to ultraprecision machining and polishing of an optical glass material. The invention is also applicable to manufacturing of a glass ceramic, substantially formed of solid oxides and having a coefficient of thermal expansion of substantially zero, in which amorphous parts and crystalline parts are intermixed. The glass ceramic is used in a glass substrate used in a hard disk recording medium, a glass substrate for a mask blank of an EUV exposure device, or other optical and mechanical parts required a high precision. In addition, general oxide ceramics are targets to be manufactured. The solid oxide is not required to be bulk, and a thin film thereof may be used.

In general, the metal oxides have various electrical characteristics, and include insulators, electronic conductors having a conductivity which is the same degree of that of a metal, ionic conductors, superconductors (high temperature superconductors of oxide), thermoelectric conversion elements, ferroelectric materials, ferromagnetic materials, and the like. Recently, strongly-correlated electron oxides have received attention and are actively studied in various aspects toward practical use thereof. The invention seems also to be applied to manufacturing of such oxides. As described above, because the nature of the oxide is diverse, it is necessary to optimize the manufacturing conditions depending on the kind of the oxide.

It is preferable to use a catalyst substance surface including a metal element in which a d-orbital of an electron thereof is in the vicinity of Fermi level, as the catalyst substance, which cuts a backbond between an oxygen element and another element, forming the solid oxide, by dissociation of a water molecule, and adsorbs it, and helps production of a decomposition product by hydrolysis. In the present invention, a solution reactive with a metal element is not used, and thus various metal elements can be used. Among them, it is particularly preferable to use transition metal elements which are hard and have a stable shape, and it is possible to use Au, Ag, Cu, Ni, Cr, Mo, and the like, including Pt having a large work function. The catalyst substance, which forms the machining reference surface, may be the metal element alone or alloy formed of a plurality of the metal elements. It has been confirmed now that the manufacturing can be performed using Pt, Au, Ag, Cu, Mo, Ni, Cr, SUS 316, or C. Of these, Pt, Cu, Mo, Ni, Cr, and SUS 316 are preferable. It has conformed that the machining speed is slow when Au or Ag is used. It is known that when a metal having a space in the d-electron orbital is used, a high effect in the machining speed can be obtained.

Although the metals described above are conductive, even a compound including the metal element which is an insulating catalyst substance can be preferably used so long as the d-orbital of the electron therein is in the vicinity of Fermi level. In this case, the potential of the machining reference surface is adjusted to a spontaneous potential. As examples other than the catalyst substance described above, it is also possible to use graphite or carbon materials such as graphene, whose machining speed is slow. The catalyst substance, which is used as the machining reference surface, is preferably a catalyst substance having a stable surface state, because it is exposed to water, an acidic solution, or a basic solution.

The machining reference surface is formed of the catalyst substance, which cuts a backbond between an oxygen element and another element, forming the solid oxide, by dissociation of a water molecule, and adsorbs it, and helps production of a decomposition product by hydrolysis. The machining reference surface literally serves as a reference surface of the machining, and thus the shape thereof must not be changed during the machining. In addition, the surface state of the machining reference surface is transferred to the surface of the object to be manufactured, and thus it is desirable to form the machining reference surface so that the surface roughness is as small as possible and the flatness is high. The surface roughness or the flatness of the machining reference surface is equalized by moving the machining reference surface relative to the object to be manufactured, and thus the surface of the object to be manufactured becomes more precise than the machining reference surface. When the machining reference surface is formed of a conductive catalyst substance, a surface potential can be controlled from the outside. Here, the catalyst substance is not necessary to be bulk, and it may be a thin film, which is formed by vapor deposition, sputtering, electroplating, or the like of a metal or a transition metal on a base material which is inexpensive and has a good shape stability. The base material, on which the catalyst substance is coated in a film state, may be hard elastomers, and, for example, fluorine-containing rubber materials may be used. It is also possible to use a product in which multiple graphene layers are formed on an SiC surface by a thermal decomposition method in which an SiC substrate, which has been flattened in a high precision, is heat-treated at a high temperature, as the machining reference surface.

It is necessary to use pure water or ultrapure water, which includes a small amount of purities and has constant properties, as the water, for realizing a pure manufacturing environment and controlling accurately the manufacturing conditions. It is generally said that pure water has an electrical resistivity of about 1 to 10 MΩ·cm and ultrapure water has an electrical resistivity of 15 MΩ·cm or more, but there is no boundary between them. In the present invention, it may be sometimes preferable to use aqueous hydrogen, which is obtained by purging hydrogen through pure water or ultrapure water, and to perform manufacturing in a state in which hydrogen is adsorbed on the catalyst substance of the machining reference surface. It is also preferable to use, as the water, a mixture in which a complex helping dissolution of decomposition products is dissolved in pure water or ultrapure water. Here, the complex has an action capable of promoting the dissolution of the decomposition product and producing complex ions to maintain the stability in water. It is preferable to adjust a pH of the water (machining liquid) to a range of 2 to 12. When the pH is either smaller (strongly acidic) or larger (strongly alkaline) than the range above, the machining speed is reduced. The nature of the oxide to be manufactured is diverse and the decomposition product, produced during the manufacturing course, is also diverse, and thus it is desirable to adjust the pH accordingly. The pH is adjusted by, for example, addition of $HNO_3$ in an acidic area, and addition of KOH in an alkaline area. There is no problem, of course, to use machining liquid having a of 7 (neutral, intact water), and, in such a case, the manufacturing can be generically applied to various oxides.

The manufacturing mechanism in the present invention can be considered phenomenologically as follows: When the machining reference surface having, at least on the surface thereof, the catalyst substance in which the d-electron orbital is in the vicinity of Fermi level is brought into contact with or is brought very close to the surface of the solid oxide in which one or more kinds of elements are bonded through oxygen, then the d-electron orbital approaches the vicinity of the surface of the solid oxide. When dissociation of water occurs and the backbond of the solid oxide becomes loose, the d-electrons act so as to reduce obstacle of reactions in the both phenomena above. Phenomenologically, when the catalyst substance approaches the oxide, the binding force of the backbond between the oxygen element and the other element, forming the oxide, becomes weak, a water molecule dissociates, the backbond between the oxygen element and the other element of the oxide is cut, and it is adsorbed, whereby a decomposition product is produced by the hydrolysis. The mechanism has a principle in which the decomposition product is eluted in the machining liquid. Here, a mechanical force is applied to the decomposition product by bringing the surface of the solid oxide into contact with the machining reference surface having the catalyst substance, and rubbing it with the machining reference surface, whereby the elution of the decomposition product in water is promoted. Even if the surface of the solid oxide is not brought into contact with the machining reference surface, movement of water generated by the relative motion between them has an action to promote the elution of the decomposition product in water.

When the catalyst substance, forming the machining reference surface, is a conductive material, it is possible to control the machining speed by adjustment of the potential of the catalyst substance. A nature of the conductive substance (for example Pt) surface to "pull" electrons from or "give" electrons to the oxide side is changed by an oxidation-reduction potential. The potential of the conductive substance is a parameter for optimizing the machining speed depending on the finally desired precision. However, when the conductive substance is adjusted to a large positive potential, $O_2$ is produced, and when it is adjusted to a large negative potential, $H_2$ is produced. In both of the cases, the bubbles interfere the manufacturing, and thus, it is necessary the adjustment is performed in a range where neither $H_2$ nor $O_2$ is produced. The control area of the potential is about 1.6 V.

For example, crystals of silicon, dioxide ($SiO_2$) have a structure in which Si positions at the center of a regular tetrahedron, O is bonded at 4 apexes, and Si is three-dimensionally bonded through O. In machining thereof, bonds in Si—O—Si are cut and Si—OH and OH—Si are produced by hydrolysis with $H_2O$. As described above, silicic acid $\{[SiO_x(OH)_{4-2x}]_n\}$, wherein $0<x<2$, is produced by the hydrolysis. The silicic acid includes typically orthosilicic acid ($H_4SiO_4$), metasilicic acid ($H_2SiO_3$), metadisilicic acid ($H_2Si_2O_5$), and the like. The decomposition products of the silicic acids are eluted in water.

Next, the present invention will be explained in more detail, based on embodiments illustrated in drawing attached. A manufacturing device A of a first embodiment shown in FIG. 1 has a structure in which manufacturing is performed in a state in which the object to be manufactured and the machining reference surface are immersed in water. The manufacturing device A is provided with a container 2 holding water 1; and a machining reference surface 3 having a catalyst substance at least on its surface, and includes a machining head 4, which is immersed with the water 1 and disposed in the container 2; a holder 6 of an object to be manufactured, which holds the object 5 to be manufactured and allows it to be immersed in water, and is disposed in the container 2 so that it is brought into contact with or is brought very close to the machining reference surface 3; a driving mechanism 7, which allows the machining head 4 and the holder 6 of the object to be manufactured to be moved relative to each other while they are brought into contact with or are brought very close to each other; and a voltage-applying means 8, which adjusts a potential of a catalyst substance forming the machining reference surface 3 in a range where neither $H_2$ nor $O_2$ is produced, wherein the water molecules are dissociated, a backbond between the oxygen element and the other element, forming the solid oxide, is cut, and it is adsorbed, and a decomposition product, produced by the hydrolysis, is eluted in water, whereby the surface of the object to be manufactured is manufactured. The device is also provided with a water circulation system 9, cleaning up the water 1 in the container 2, and maintaining constantly a water level. The water circulation system 9 is formed of a supply pipe 9A, a drain pipe 9B, a treating liquid purifier, a buffer tank, and a pump, which are not shown in the view, and the like. The voltage-applying means 8 adjusts the potential of the catalyst substance, forming the machining reference surface 3, to a range of about −0.4 to +1.4 V (including zero).

In the manufacturing device A illustrated, the machining head 4 is a disk-shaped rotary platen, which allows the holder 6 of the object to be manufactured, holding the object 5 to be manufactured whose area is smaller than that of the platen, and the machining head 4 to be rotated at a pre-determined speed around eccentric axes which are parallel to each other. The holder 6 of the object to be manufactured can regulate a contact pressure of the object 5 to be manufactured against the machining reference surface 3 by regulating a load. The machining head 4 and the holder 6 of the object to be manufactured have, desirably, a built-in temperature-controlling function, because the machining temperature can be maintained constantly at a pre-determined temperature. When the machining reference surface 3 is made narrower than the surface of the object 5 to be manufactured, a position to the surface of the object 5 to be manufactured and a staying time of the small machining head 4 are controlled to control a locally machining quantity of the surface of the object 5 to be manufactured, i.e., a local manufacturing can be performed by numerical control.

Figure 2:
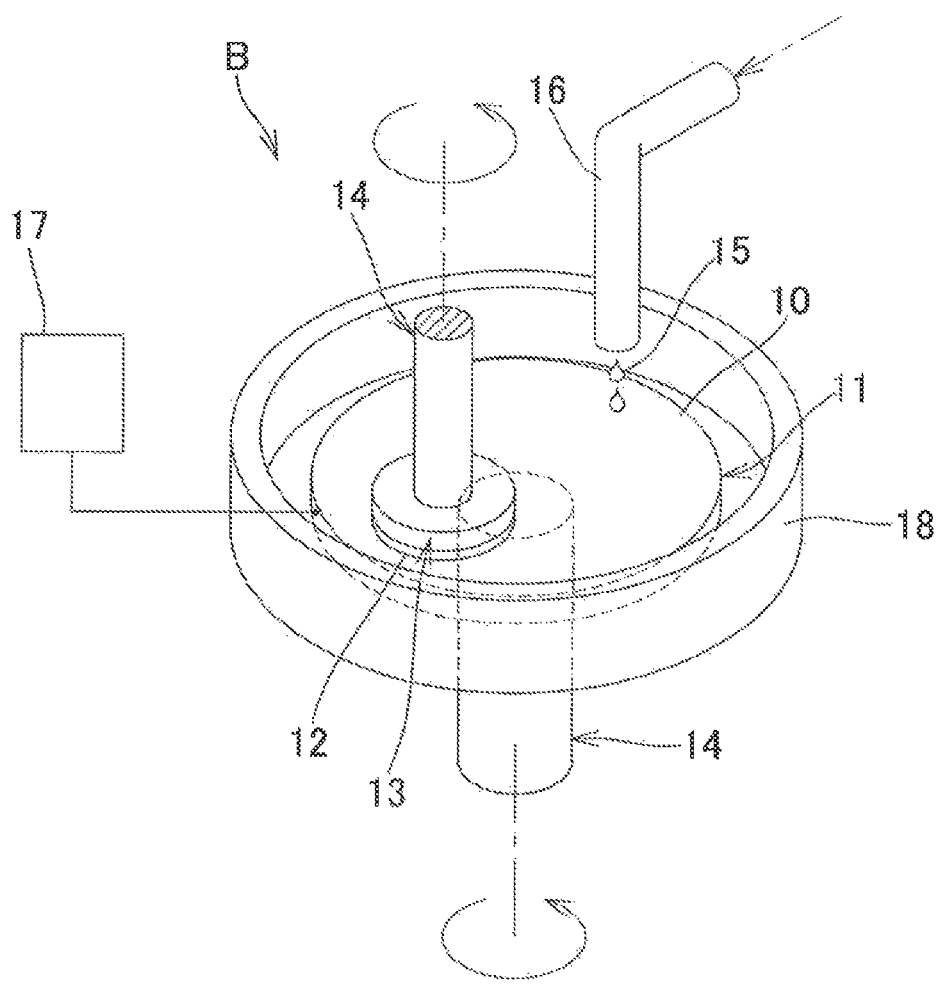
FIG. 2 is a simplified perspective view showing a manufacturing device of a second embodiment (a flattening device) of the present invention.
Figure 2:
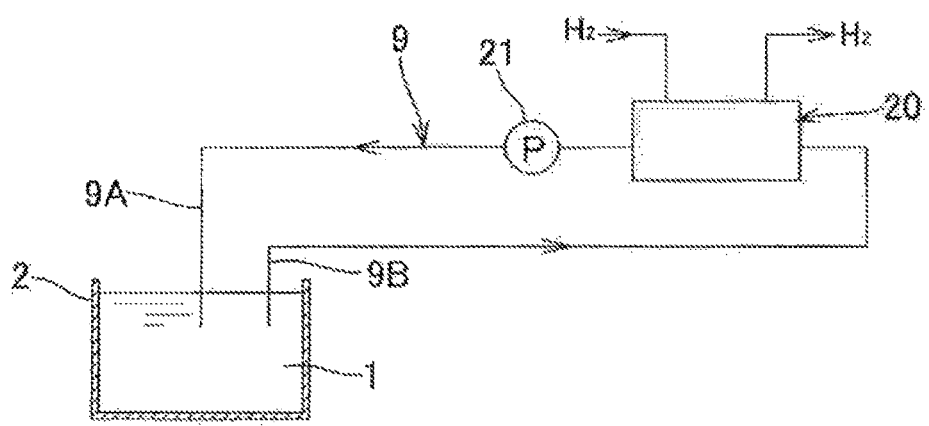

A manufacturing device B of a second embodiment shown in FIG. 2 has a structure in which manufacturing is performed while water, which is added dropwise to between an object to be manufactured and a machining reference surface, is supplied. The manufacturing device B includes a machining head 11, which is provided with a machining reference surface 10 having a catalyst substance at least on its surface; a holder 13 of an object to be manufactured, which holds an object 12 to be manufactured so as to face it to the machining reference surface 10; a driving mechanism 14, which allows the machining reference surface 10 in the machining head 11 and the object 12 to be manufactured held in the holder 13 of the object to be manufactured to be moved relative to each other while they are brought into contact with or are brought very close to each other; a water-supplying means 16, which supplies water to between the machining reference surface 10 in the machining head 11 and the object 12 to be manufactured held in the holder 13 of the object to be manufactured; and a voltage-applying means 17, which adjusts a potential of a catalyst substance forming the machining reference surface 10 in a range where neither $H_2$ nor $O_2$ is produced, wherein the water molecules are dissociated to cut a backbond between the oxygen element and the other element forming the solid oxide, and it is adsorbed, and a decomposition product by the hydrolysis is eluted in water, whereby the surface of the object to be manufactured is manufactured. Here, in order to prevent scatter of water, a container 18 is provided around the machining head 11.

The manufacturing device B can also be formed so as to perform not only smoothing a flat plane but also machining by numerical control to an arbitrary curved surface, as the manufacturing device A. In addition, it is also preferable to manufacture the surface of the object to be manufactured while the surface is activated by irradiating excited light having a specific wavelength to the surface.

As shown in FIG. 3, it is preferable that a gas-liquid mixing device 20 is provided in the water circulation system 9, water and hydrogen gas are mixed in the gas-liquid mixing device 20 while water is cycled through a pump 21, and the aqueous hydrogen, in which hydrogen is dissolved, is supplied to the surface to be manufactured through the supply pipe 9A or the water-supplying means 16. Needless to say, gases other than hydrogen can be dissolved as necessary.

Next, results of test manufacturing of optical glass, quartz glass (pure $SiO_2$), single crystalline sapphire (α-$Al_2O_3$), or ZnO single crystals, which are the solid oxide, using a manufacturing device A in which Pt is used as the catalyst substance forming the machining reference surface, are shown in FIG. 4 to FIG. 8. The optical glass used in the test manufacturing is fluorine-containing optical glass (S-FPL51 manufactured by Ohara Inc.), which is used for general optical lenses and the like, or a lanthanide optical glass (S-LAH55 manufactured by Ohara Inc.). In the quartz glass, a CMP surface was used as the surface before the manufacturing. The manufacturing properties of the optical glass, the quartz glass, and ZnO single crystals were evaluated by observing the surface using a phase shift interference microscope (Zygo Corporation, NewView) and an atomic force microscope (AFM) before and after the manufacturing.

FIG. 4 shows the results of the flattening of the optical glass (fluorine-containing). The machining pressure is 200 hPa, the rotating speed is 10 rpm, ultrapure water is used as the solution, and the machining time is one hour. The machining speed was 6751 nm/hour. The phase shift interference micrographs according to the manufacturing show that rms: 0.879 nm before the manufacturing is changed to rms: 0.385 nm after manufacturing, and the AFM images show that rms: 1.861 nm before the manufacturing is changed to rims: 0.371 nm after manufacturing, i.e., the surface roughness was remarkably improved. It should be noted that the machining speed is high such as 6.7 μm/hour, and it was demonstrated that industrial manufacturing can be sufficiently performed using ultrapure water alone. The fluorine-containing optical glass used herein is a fluorine-containing phosphate optical glass, which is a glass type in which bonding in the glass has generally a strong ion bonding property, not a covalency seen in Si—O. The composition thereof includes oxides of P, Al, Ba, Gd, Nb, and F as main components, and includes selectively other oxides of Y, La, Yb, Ta, Lu, Ti, Zr, W, Bi, Mg, Ca, Sr, Zn, Li, Na, K, Cs, T1, Si, B, Sb, and the like in trace amounts.

FIG. 5 shows the results of the flattening of the optical glass (lanthanide). The machining pressure is 200 hPa, the rotating speed is 10 rpm, ultrapure water is used as the solution, and the machining time is one hour. The machining speed was 5977 nm/hour. The phase shift interference micrographs according to the manufacturing show that rms: 0.232 nm before the manufacturing is changed to rms: 0.476 nm after manufacturing, and the AFM images show that rims: 0.408 nm before the manufacturing is changed to rms: 0.828 nm after manufacturing, i.e., the surface roughness was slightly deteriorated. The lanthanide optical glass used herein is a borosilicate lanthanide optical glass, and its composition includes oxides of Si, B, La, Y, Gd, Zr, Nb, Zn, Sr, Ba, Li, Sb, As, and the like.

FIG. 6 shows the results of the flattening of the quartz glass ($SiO_2$). The machining pressure is 200 hPa, the rotating speed is 10 rpm, ultrapure water is used as the solution, and the machining time is one hour. The machining speed was 831 nm/hour. The phase shift interference micrographs according to the manufacturing show that rms: 0.338 nm before the manufacturing is changed to rms: 0.147 nm after manufacturing, i.e., the surface roughness is remarkably improved. The AFM images show that rms: 1.455 nm before the manufacturing is changed to rms: 0.103 nm after manufacturing, i.e., the surface roughness is remarkably improved. Scratches, which were observed on the surface before the manufacturing, were removed, and it is seen that the surface was atomically smooth.

FIG. 7 shows the results of the flattening of the single crystalline sapphire ($\alpha$-$Al_2O_3$). A 2-inch sapphire substrate (0001) surface was used for a sample. The machining pressure is 200 hPa, the rotating speed is 10 rpm, pure water is used as the solution, and the machining time is 3 hours. The machining speed was 3 nm/hour. The phase shift interference micrographs according to the manufacturing show that rms: 0.164 nm before the manufacturing is changed to rms: 0.151 nm after manufacturing, and the AFM images show that rms: 0.122 nm before the manufacturing is changed to rms: 0.122 nm after manufacturing. The surface roughness was hardly changed, but the crystal structure was improved. In the phase shift interference microscope observation area, the flatness is maintained before and after the manufacturing. In the AIM observation, though a step terrace structure is observed before the manufacturing, a waved shape is formed at the step end. On the other hand, it was found that the surface, which has been subjected to the manufacturing of the present invention, had a step terrace structure having a linear step shape. The step height is about 0.3 nm, corresponding to one bilayer, and it became clear that the surface had a step terrace structure with no step bunching after the manufacturing of the present invention.

FIG. 8 shows the results of the flattening of the ZnO single crystals. A 2-inch ZnO substrate (0001) surface, which had been treated with CMP, was used for a sample. The machining pressure is 200 hPa, the rotating speed is 10 rpm, pure water is used as the solution, and the machining time is 10 minutes. The machining speed was 126.1 nm/hour. The AFM images according to the manufacturing show that rms: 0.161 nm (1×1 $\mu m^2$ area) before the manufacturing is changed to rms: 0.163 nm (1×1 $\mu m^2$ area), and rms: 0.164 nm (5×5 $\mu m^2$ area) after the manufacturing. The surface roughness was not so changed, but a step terrace structure could be clearly observed after the manufacturing, and a crystallographically excellent surface could be obtained.

The observation results using the interference microscope are that rms: about 0.1 nm in the observation area before and after the manufacturing, i.e., there was no change. Considering that the surface of the ZnO single crystals before the manufacturing is a surface which has been preciously polished with CMP, it can be demonstrated that the crystallographically more excellent surface than that obtained using CMP was obtained by the manufacturing method of the present invention. It is found that if the machining time is shortened, the manufacturing method of the present invention can be utilized as a precision washing.

The manufacturing tests described above could demonstrate that the optical glass, which was the solid oxide, could be subjected to flattening in a sufficient precision by using the manufacturing method and the manufacturing device of the present invention. The optical glass is not a simple oxide but a complex formed of various kinds of oxides, and the machining speed varies depending on the oxide forming the glass. The present invention is, however, image manufacturing in which the flatness is transferred, using the machining reference surface, and thus such a complex of various kinds of oxides can be subjected to flattening in a sufficient precision in principle. It is considered that the different results between the two kinds of the optical glasses described above in the surface roughness after the manufacturing is caused by the difference of the glass type. On the other hand, the quartz glass is a single kind of oxide of $SiO_2$ and the ZnO single crystals are also a single kind of oxide, and thus the machining speed is the same on any place of the surface. As a result, the ultraprecise flat surface could be obtained by the flattening of the present invention. In the manufacturing tests, an optimization of the manufacturing conditions or a trial to improve the flatness are not particularly tried, and thus when such trials are performed, the surface roughness can be further improved and the machining speed can be further increased. In order to finally improve the surface roughness, it is effective to perform a finishing manufacturing with a decreased machining speed.

It is said that when a glass substrate for a liquid crystal display or a hard disk recording medium is polished by CMP using a $CeO_2$ polishing agent, the machining speed is about 0.4 $\mu$m/minute (24 $\mu$m/hour). On the other hand, when the fluorine-containing optical glass is manufactured by the present invention, the machining speed was 6.7 $\mu$m/hour. In this ease, the machining speed in the present invention is one fourth to one third the machining speed in CMP using $CeO_2$, and this is a surprising result as the manufacturing method using only water. It is firmly believed that a machining speed, which is comparable to that in CMP, will be able to be obtained by optimization of the manufacturing conditions in future. For example, when an optimal other transition metal is used for the object to be manufactured instead of Pt, the machining speed can be remarkably increased, and when the rotation speed is increased, the machining speed can also be increased.

FIG. 9 shows a local manufacturing device C, which is a device capable of numerical control manufacturing to an arbitrary curved surface in principle. The device does not aim at flattening, but manufactures only a part area on the object to be manufactured by bringing a rotor of the catalyst substance into contact with the surface of the object to be manufactured while the rotor is rotated.

The local manufacturing device C is a manufacturing device in which an object 33 to be manufactured is held in pure water 32 collected in a water tank 31, and a ball 36 of the catalyst substance, which is attached to the tip of a rotary axis 35, disposed in a vertical direction and connected to a stepping motor 34, is brought into contact with the surface of the object 33 to be manufactured and rotated in a constant contact pressure in water. More specifically, the water tank 31 and an XY stage 39 are fixed on a horizontal plate 38 provided on a Z stage 37, and a holder 40 of the object to be manufactured, which is driven on the XY stage 39, extends into an inside of the water tank 31 and holds the object 33 to be manufactured. In order to minimize a runout, the rotary axis 35 is fixed by double bearings 41 and 41, and a junction thereof with a head part 42 at which the ball 36 of the catalyst substance is attached is formed into a tapered shape to inhibit a position displacement occurring every desorption. An O-ring whose surface is covered with a film of a pre-determined catalyst substance was used as the ball 36 of the catalyst substance. As the O-ring, a P44 standard size (an outer diameter of 50.7 mm and a thickness of 3.5 mm) made of fluorine-containing rubber was used. The stepping motor 34, the rotary axis 35, and the bearings 41 and 41 are attached to the same vertical plate 43, an upper end of the vertical plate 43 is connected to a frame 44 through a plate spring 45, and a balance type balancer 46 adjusts the verticality of the rotary axis 35.

It is possible to move the object 33 to be manufactured in an arbitrary amount in a direction of the ball 36 of the catalyst substance by the operation of the X stage, and a contact pressure between the surface of the object 33 to be manufactured and the ball 36 of the catalyst substance is adjusted by controlling a movement of the rotary axis 35 using an electric micrometer. A catalytic metal on the ball 36 of the catalyst substance is electrically joined to a potentiostat through a rotary joint 47 to form a three-electrode cell, which performs potential control. In the present invention, it is necessary to precisely control the potential of the catalytic metal. In the water tank 31, the ball 36 of the catalyst substance is disposed as a working electrode, and a reference electrode 48 and a counter electrode 49 are further disposed. The three electrodes are combined with the potentiostat to form the three-electrode cell. The majority of current was allowed to flow to the counter electrode 49, and fine current was allowed to flow to the reference electrode 48, whereby a potential of the working electrode (the ball 36 of the catalyst substance) was decided. At this time, the control of the potential is automatically performed by the potentiostat, which is not shown in the drawing. A silver-silver chloride electrode was employed as the reference electrode 48.

The local manufacturing device C shown in FIG. 9 is an NC manufacturing device capable of creating an arbitrary curved surface having a smaller curvature than that of the ball 36 of the catalyst substance by numerically controlling and driving each stage, and changing a relative position of the object 33 to be manufactured and ball 36 of the catalyst substance to move a unit machining mark.

Using the local manufacturing device C, controllability of a machining speed was examined. First, quartz glass was manufactured using Pt as the catalytic metal. The contact pressure is about 1000 hPa, the rotating speed is 24 rpm, the machining liquid is pure water, and the potential of Pt is a spontaneous potential. Only an elliptical area with which the Pt is brought into contact is manufactured. FIG. 10 shows the results obtained by examining the contact pressure dependency of the machining speed, defining the maximum depth in the machining mark as the machining quantity. It is found that the machining quantity is increased with the increased of the pressure.

Next, quartz glass was manufactured in the same manufacturing conditions as above, using balls 36 of the catalyst substance on which various catalytic metals were covered in a film state, wherein the contact pressure was about 1000 hPa, the rotating speed was 24 rpm, and the machining liquid was pure water. The potential of the catalytic metal is a spontaneous potential. Tendency of occurrence of a dissociative adsorption to a catalytic metal can be qualitatively organized by an electron unoccupancy in the d-orbital, and it is known that it can be grouped as follows: Group A includes the groups 4, 5, 6, and 8 elements such as Cr, Fe, and Mo, in which there are many unoccupied orbitals in the d-orbital. Group B1 includes the groups 9 and 10 elements of Ni and Co, in which there is 1 to 3 unoccupied d-orbitals. Group B2 includes the groups 9 and 10 elements such as Pt and Pd. Group C includes the groups 7 and 11 elements of Cu and Mn. Group D includes the group 11 elements including Au in which the d-orbital is occupied. Group E includes the groups 11 and 12 elements such as Ag and Zn. It is known that the chemical adsorption property is gradually reduced from group A, group B1, group B2, group C, group D, to group E in this order.

One element is selected from each Group as the catalytic metal, and quartz glass is manufactured. The results of the catalytic metal dependency of the machining speed are shown in FIG. 11. The results shows that there is clearly a correlation between the chemical adsorption property and the machining speed, and it was found that the machining speed obtained in a case of using Cr (Group A) or Ni (Group B1) was faster one digit at most compared to the speed obtained in a ease of using Pt (Group B2). When Au or Ag, belonging to Group D or E, is used, the manufacturing hardly proceeded because the d-orbital is occupied by electrons. The results described above revealed that the catalytic metal, in the present invention, promoted the dissociation of $H_2O$ molecules. When stainless steel (SUS 316) was used as the catalytic metal, a high machining speed could also be obtained. It is considered that SUS 316 includes 10 to 14% by weight of Ni, 16 to 18% by weight of Cr, 2 to 3% by weight of Mo, and other elements, and the Cr and the Ni contribute the manufacturing. When graphite was used as the catalyst substance, the manufacturing could also be performed, but the machining speed is slow, which was the same level as in Au or Ag.

From the results above, it is preferable to use metals belonging to Groups A, and B2 as the catalytic metal formed of a single element, in terms of the machining speed, and, in practical, metals comparatively inexpensive and easily handled are selected and used. In this case, it is also preferable to use alloy formed of a plurality of metal elements in addition to the simple substance of the metal element. When Cu is used, the machining speed is slow, because the d-orbital in Cu is occupied by electrons, but CuO has a catalyst function, though it is insulating. As described above, even if a metal has a poor catalyst function, a compound including such a metal functions as the catalyst substance, which cuts a backbond between an oxygen element and another element, forming the solid oxide, by dissociation of a water molecule, and adsorbs it, and helps production of a decomposition product by hydrolysis, if the d-orbital of the electron of the metal element is in the vicinity of Fermi level and the part appears on the surface.

Next, catalyst potential dependency of a machining speed in a quartz glass substrate was examined at pH 1, 3, 7, or 11 using the local manufacturing device C. As a solution, an aqueous $HNO_3$ solution, phosphate buffer, and an aqueous KOH solution were used, whose pH was adjusted to each value described above. The manufacturing conditions are as follows: the catalytic metal is Pt, the contact pressure is about 1000 hPa, the rotating speed is 24 rpm, and the machining 1 quid is pure water. Found values of the spontaneous potentials (open circuit potential) are respectively 0.68, 0.57, 0.32, and 0.17 V vs. Ag/AgCl at pH 1, pH 3, pH 7, and pH 11. FIG. 12 to FIG. 15 show the results of the manufacturing in each solution. It became clear that the machining speed depends on the catalyst potential in the all solutions. Taking the manufacturing results obtained when using a KOH solution with pH 11, shown in FIG. 15, as an example, considerations are made. There was a peak of the machining speed at about −0.7 V vs. Ag/AgCl, and the machining speed was almost zero at a potential of 0.5 V or more, or −1.5 V vs. Ag/AgCl or less. This occurs because oxygen and hydrogen, separately produced, are adsorbed when the potential is scanned in a positive negative direction, which shows that the manufacturing does not proceed at all when the adsorption amount is excessive. On the other hand, it can be considered that the adsorption amount on the Pt surface is the minimum amount around the peak value, and the machining speed was about 3 times the speed at non-voltage impression. The result above shows that the machining speed can be controlled by controlling the potential of the catalyst substance forming the machining reference surface.

FIG. 16 shows a comparison of the peak potential of the machining speed and the position of the spontaneous potential at each pH. The peak potential goes to a more negative potential with the movement of the pH to an alkali side. This can be understood that the hydroxyl group or oxygen is more remarkably adsorbed to the catalytic metal at a higher pH, and thus more negative potential is necessary for detaching it. On the other hand, hydrogen is excessively adsorbed at pH 1, and the maximum machining speed can be obtained by adjusting the potential to a potential more positive than the spontaneous potential. In FIG. 16, a line on the lower side shows a production limit of $H_2$ and a line on the upper side shows a production limit of $O_2$, and the potential is controlled between the upper and lower lines.

FIG. 17 shows the maximum machining speed at the pH of each solution. It is a solution pH dependency of the machining speed, excluding influences provided by the adsorption state of the Pt surface. When an acidic solution is used, the maximum machining speed is obtained, followed by a basic solution and then a neutral solution. Considering the results above, first, H atoms are dissociated from $H_2O$ molecules by an action of the catalyst in an etching step, and produced hydroxyl groups are adsorbed to Si atoms. Subsequently, H atoms are adsorbed to O atoms. It can be considered that the H atoms include not only the H atoms on the catalyst, which are dissociated from the $H_2O$ molecules but also moving H atoms in the solution. For that reason, the machining speed is faster in the acidic solution. On the other hand, it can be considered that the phenomenon in which the machining speed in the basic solution is faster than that in the neutral solution is caused by the maximum dissolution rate of $Si(OH)_x$, which is a product manufactured, in a basic condition.

FIG. 18 shows results obtained by using Pt as the machining reference surface in aqueous hydrogen, and manufacturing quartz glass changing an applied voltage. A spontaneous potential of Pt is −0.40 V vs Ag/AgCl in aqueous hydrogen. When the applied voltage was 0 V in the aqueous hydrogen, i.e., the potential of the machining reference surface was −0.40 V, the machining speed was 0 nm/hour. It can be considered that this occurs because the Pt surface is covered with an excessive amount of hydrogen and thus the $H_2O$ molecules cannot approach a distance at which they exert the interaction with the surface. From the foregoing, it was realized that the manufacturing cannot proceed by only the hydrogen produced on the catalyst, and the influence of the adsorption state on the catalyst surface is very large. When the applied voltage is increased to increase the potential of the machining reference surface, the machining speed reaches the peak of about 500 nm/hour at a potential of about 0.4 V vs Ag/AgCl, and then the speed is decreased up to a machining speed of about 50 nm/hour at a potential of 1.3V vs Ag/AgCl.

FIG. 19 is a graph showing a relationship between the pH and the machining speed in a case where quartz glass is manufactured by using a local manufacturing device using a ball of the catalyst substance formed of Pt under a spontaneous potential, without performing the potential control. The manufacturing conditions are as follows: the machining pressure is 200 hPa, the rotating speed is 10 rpm, and the machining liquid is an aqueous $HNO_3$ solution (pH of 0 to 4) and the aqueous KOH solution (pH of 10 to 13). The machining time is 30 minutes in each case. As a result, it is found that there is a machining speed peak at around pH 3.

Although there are many parts which have not yet been solved in the manufacturing mechanism in the present invention, it is clear that the machining speed can be controlled by changing the potential of the machining reference surface. The machining speed can also be controlled by changing the pH of the machining liquid. When the surface of the solid oxide is subjected to the numerical control manufacturing to an arbitrary shape, it is important to control the machining speed.

According to the present invention, it is possible to precisely manufacture quartz glass, various optical glasses, metal oxides having various electrical characteristics, or the like. In the manufacturing method of the present invention, it may also be possible to perform manufacturing, dispersing metal fine particles in water, or perform manufacturing co-using a polis agent, which has hitherto been used in CMP.

REFERENCE SIGNS LIST

A Manufacturing device
B Manufacturing device
1 Water
2 Container
3 Machining reference surface
4 Machining head
5 Object to be manufactured
6 Holder of object to be manufactured
7 Driving mechanism
8 Voltage-applying means
9 Water circulation system
9A. Supply pipe
9B Drain pipe
10 Machining reference surface
11 Machining head
12 Object to be manufactured
13 Holder of object to be manufactured
14 Driving mechanism
15 Water
16 Water-supplying means
17 Voltage-applying means
18 Container
20 Gas-liquid mixing device
21 Pump
30 Local manufacturing device
31 Water tank
32 Pure water 33 Glass
34 Motor
35 Rotary axis
36 Ball of catalyst substance
37 Z stage
38 Horizontal plate
XY Stage
40 Holder of object to be manufactured
41 Bearing
42 Head part
43 Vertical plate
44 Frame
45 Plate spring
46 Balancer
47 Rotary joint
48 Reference electrode
49 Counter electrode

The invention claimed is:

1. A method for machining an object to be manufactured, the method comprising:
placing, in a container containing a machining liquid, the object to be manufactured and a machining reference surface having a conductive catalyst substance at least on its surface, with the object to be manufactured and the machining reference surface being brought into contact with or very close to each other, and immersing the object to be manufactured and the machining reference surface in the machining liquid, wherein the object to be manufactured is a solid oxide in which one or more kinds of elements are bonded through oxygen or a multicomponent solid oxide formed of a plurality of oxides, by machining a surface of the object to be manufactured to a flat surface or an arbitrary curved surface, with machining the surface of the object to be manufactured through a hydrolysis process in the presence of water,
maintaining a potential of the machining reference surface in a range where neither $H_2$ nor $O_2$ is produced, including a potential when no external potential is applied, and
allowing the object to be manufactured and the machining reference surface to be moved relatively to each other, with the object to be manufactured and the machining reference surface being brought into contact with or very close to each other,
wherein the machining liquid is prepared substantially only from water, and is completely free from a polishing agent or abrasive grains,
the catalyst substance promotes dissociation of a water molecule and impairs bond between an oxygen atom and another atom,
a hydroxyl group dissociated from the water molecule is adsorbed to the surface of the object to be manufactured to cut the bond, to thereby produce a decomposition product by cutting the bond between the atoms forming the solid oxide, and a machining performed on the surface of the object to be manufactured by dissolving the decomposition product in the machining liquid takes place selectively in the immediate proximity of the catalyst substance relative to the surface distant from the catalyst substance,
the catalyst substance as a working electrode, a reference electrode, and a counter electrode are disposed in the machining liquid,
the reference electrode and the counter electrode are spaced apart from the object to be manufactured, and the working electrode, the reference electrode, and the counter electrode being combined to form a three-electrode cell.

2. The method for machining a solid oxide according to claim 1,
wherein a catalyst substance surface, including a metal element in which a d-orbital of an electron thereof is in the vicinity of Fermi level, is used as the machining reference surface.

3. The method for machining a solid oxide according to claim 2,
wherein the metal element is a transition metal element.

4. The method for machining a solid oxide according to claim 1,
wherein a machining speed is controlled by changing a potential of the catalyst substance.

5. The method for machining a solid oxide according to claim 4,
wherein the machining liquid is $H_2$-purged pure water or $H_2$-purged ultrapure water, and the machining is performed in a state in which hydrogen is adsorbed in the catalyst substance on the machining reference surface, wherein the hydrogen is provided from outside the water.

6. The method for machining a solid oxide according to claim 1,
wherein the machining liquid is a mixture in which pure water or ultrapure water is mixed with a complex helping dissolution of the decomposition product.

7. The method for machining a solid oxide according to claim 1,
wherein a pH of the machining liquid is adjusted to a range of 2 to 12 depending on the decomposition product.

8. A method for machining an object to be manufactured, which is a solid oxide in which one or more kinds of elements are bonded through oxygen or a multicomponent solid oxide formed of a plurality of the oxides, by machining a surface of the object to be manufactured to a flat surface or an arbitrary curved surface, with machining the surface of the object to be manufactured through a hydrolysis process in the presence of water, the method comprising:
disposing the object to be manufactured and a machining reference surface having a conductive catalyst substance at least on its surface so that the object to be manufactured and the machining reference surface are brought into contact with or very close to each other,
supplying a machining liquid between the object to be manufactured and the machining reference surface,
setting a potential of the machining reference surface to be a spontaneous potential to which no voltage is supplied from an outside, the spontaneous potential producing neither $H_2$ nor $O_2$, and
allowing the machining reference surface and the object to be manufactured to be moved relatively to each other, with the object to be manufactured and the machining reference surface being brought into contact with or very close to each other,
wherein the machining liquid is prepared substantially only from water, and is completely free from a polishing agent or abrasive grains,
the catalyst substance promotes dissociation of a water molecule and impairs bond between an oxygen atom and another atom, and
a hydroxyl group dissociated from the water molecule is adsorbed to the surface of the object to be manufactured to cut the bond, to thereby produce a decomposition product by cutting the bond between the atoms forming the solid oxide, and a machining performed on the surface of the object to be manufactured by dissolving the decomposition product in the machining liquid takes place selectively in the immediate proximity of the catalyst substance relative to the surface distant from the catalyst substance.

9. The method for machining a solid oxide according to claim 8,
wherein a catalyst substance surface, including a metal element in which a d-orbital of an electron thereof is in the vicinity of Fermi level, is used as the machining reference surface.

10. The method for machining a solid oxide according to claim 9,
wherein the metal element is a transition metal element.

11. The method for machining a solid oxide according to claim 8,
wherein the machining liquid is $H_2$-purged pure water or $H_2$-purged ultrapure water, and the machining is performed in a state in which hydrogen is adsorbed in the catalyst substance on the machining reference surface, wherein the hydrogen is provided from outside the water.

12. The method for machining a solid oxide according to claim 8,
wherein the machining liquid is a mixture in which pure water or ultrapure water is mixed with a complex helping dissolution of the decomposition product.

13. The method for machining a solid oxide according to claim 8,
wherein a pH of the machining liquid is adjusted to a range of 2 to 12 depending on the decomposition product.

14. The method for machining a solid oxide according to claim 1, wherein
the catalyst substance as the working electrode, which is rotated, is electrically joined to a potentiostat through a rotary joint, and the reference electrode and the counter electrode are joined to the potentiostat, so that a three-electrode cell is formed, which performs potential control.

15. The method for machining a solid oxide according to claim 1,
wherein no voltage is applied between the catalyst substance and the object to be manufactured.

16. The method for machining a solid oxide according to claim 8,
wherein no voltage is applied between the catalyst substance and the object to be manufactured.

17. The method for machining a solid oxide according to claim 1, wherein, said maintaining of the potential of the machining reference surface in the range where neither $H_2$ or $O_2$ is produced, corresponds to a range of −0.4 to +1.4 V.

18. The method for machining a solid oxide according to claim 1, wherein
a ball of the catalyst substance is attached to a tip of a rotary means, the rotary means is disposed in a vertical direction and is connected to a stepping motor, the ball is brought into contact with or very close to the object to be manufactured and rotated in a constant contact pressure in the machining liquid when the object to be manufactured and the machining reference surface are brought into contact with or very close to each other, the container and a first stage are fixed on a horizontal plate provided on a second stage,
a holder of the object to be manufactured, which is driven on the first stage, extends to an inside of the container and holds the object to be manufactured,
the stepping motor and the rotary means are attached to a vertical plate,
the working electrode is spaced apart from the object to be manufactured when the object to be manufactured and the machining reference surface are moved away from each other, and
the relative movement of the object to be manufactured and the machining reference surface being configured to create a curved surface having a smaller curvature than that of the ball by controlling and driving the first and second stages.

19. The method for machining a solid oxide according to claim 18, wherein the contact pressure between the object to be manufactured and the ball is adjusted by controlling a movement of the rotary means using an electric micrometer.

* * * * *